United States Patent [19]
Nilssen

[11] Patent Number: 5,736,819
[45] Date of Patent: Apr. 7, 1998

[54] PARALLEL-TUNED ELECTRONIC BALLAST WITH SPECIAL OUTPUT VOLTAGE WAVEFORM

[76] Inventor: Ole K. Nilssen, 408 Caesar Dr., Barrington, Ill. 60010

[21] Appl. No.: 404,090

[22] Filed: Mar. 14, 1995

Related U.S. Application Data

[63] Continuation of Ser. No. 196,812, Feb. 2, 1994, Pat. No. 5,432,409, which is a continuation of Ser. No. 5,381, Jan. 15, 1993, abandoned, which is a continuation of Ser. No. 840,528, Feb. 25, 1992, Pat. No. 5,189,342, which is a continuation of Ser. No. 646,497, Jan. 28, 1991, which is a continuation of Ser. No. 107,795, Oct. 13, 1987, abandoned, which is a continuation-in-part of Ser. No. 658,423, Oct. 5, 1984, abandoned, which is a continuation-in-part of Ser. No. 555,426, Nov. 23, 1983, abandoned, which is a continuation of Ser. No. 178,107, Aug. 14, 1980, abandoned, which is a continuation-in-part of Ser. No. 973,741, Dec. 28, 1978, abandoned, which is a continuation-in-part of Ser. No. 890,586, Mar. 20, 1978, Pat. No. 4,184,128.

[51] Int. Cl.$^6$ ...................................... H05B 37/02
[52] U.S. Cl. ................ 315/209 R; 315/244; 315/241 R; 315/227 R; 315/DIG. 5
[58] Field of Search ............................ 315/209 R, 291, 315/307, 227 R, 308, 243, 244, 241 R, DIG. 5

[56] References Cited

U.S. PATENT DOCUMENTS

| | | | |
|---|---|---|---|
| 4,277,726 | 7/1981 | Burke | 315/98 |
| 5,189,342 | 2/1993 | Nilssen | 315/226 |

Primary Examiner—Frank Gonzalez
Assistant Examiner—Reginald A. Ratliff

[57] ABSTRACT

Power to a self-oscillating inverter ballast is supplied from a DC voltage source through an inductor means having two separate windings on a common magnetic core—with one winding being positioned in each leg of the power supply. The inverter is loaded by way of a parallel-tuned L-C circuit connected across the inverter's output, thereby providing an output voltage thereat. The output voltage consists of sinusoidally-shaped voltage pulses of alternating polarity, with a distinct brief period of discontinuity at or near the cross-over points. A fluorescent lamp is connected by way of a current-limiting capacitor with the inverter's output.

20 Claims, 1 Drawing Sheet

5,736,819

PARALLEL-TUNED ELECTRONIC BALLAST WITH SPECIAL OUTPUT VOLTAGE WAVEFORM

This application is a continuation of U.S. application Ser. No. 08/196,812, filed Feb. 2, 1994, now U.S. Pat. No. 5,432,409, which is a continuation of application Ser. No. 08/005,381, filed Jan. 15, 1993, now abandoned which is a continuation of U.S. application Ser. No. 07/840,528, filed Feb. 25, 1992, now U.S. Pat. No. 5,189,242, which is a continuation of U.S. application Ser. No. 07/646,497, filed Jan. 28, 1991, which is a continuation of U.S. application Ser. No. 07/107,795, filed Oct. 13, 1987, abandoned, which is a continuation in part of U.S. application Ser. No. 06/658,423, filed Oct. 5, 1984, now abandoned, which is a continuation in part of U.S. application Ser. No. 06/555,426, filed Nov. 23, 1983, now abandoned, which is a continuation of U.S. application Ser. No. 06/178,107, filed Aug. 14, 1980, now abandoned, which is a continuation in part of U.S. application Ser. No. 05/973,741, filed Dec. 28, 1978, now abandoned, which is a continuation in part of U.S. application Ser. No. 05/890,586, filed Mar. 20, 1978, now U.S. Pat. No. 4,184,128.

BACKGROUND OF THE INVENTION

1. Field of Invention

The present invention relates to a self-oscillating parallel-tuned transistor inverter ballast, particularly of a kind that comprises bridge-type inverter means.

2. Description of Prior Art

Although self-oscillating parallel-tuned transistor inverter ballasts do presently exist—as for instance described in U.S. Pat. No. 4,277,726 to Burke—bridge-type inverters of that type do not presently exist.

SUMMARY OF THE INVENTION

1. Objects of the Invention

An object of the present invention is that of providing a self-oscillating inverter ballast for powering a gas discharge lamp means.

Another object is that of providing an inverter ballast that is particularly cost-effective, efficient and versatile in use.

These, as well as other important objects and advantages of the present invention will become apparent from the following description.

2. Brief Description

In its preferred embodiment, subject invention is a full-bridge inverter comprising four switching transistors and being symmetrically powered from a center-tapped DC voltage source through an inductor means having two windings on a single magnetic core—with one winding positioned in each leg of the DC source. This full-bridge inverter has a center-tapped parallel-resonant L-C circuit connected across its output, and is made to self-oscillate by way of two positive feedback current-transformers, each connected in series with the center-tapped L-C circuit and a fluorescent lamp load connected thereto.

The outputs from the current-transformers are applied to the control terminals of the four switching transistors, thereby providing load-proportional drive to these transistors.

The center-tapped DC voltage source, the inductor means and the full-bridge inverter circuit with its two feedback current-transformers are connected together in symmetrical fashion; which provides for the center-tap of the inverter output to be at the same potential as the center-tap of the DC voltage source. Thus, since the center-tap of the DC source is grounded, the center-tap of the inverter's output is grounded as well; which, in turn, implies that any load connected to the inverter's output is symmetrically referenced to ground.

The feedback current-transformers are saturable and so designed as to saturate approximately at the time the inverter's output voltage reaches zero magnitude.

A Zener-type voltage-limiting device is connected directly between the inverter's DC power input terminals, thereby to protect the transistors from voltage transients of excessive magnitude.

The fluorescent lamp means is connected with the inverter's output by way of a current-limiting capacitor.

DESCRIPTION OF THE PREFERRED EMBODIMENT

Details of Construction

Figure 1:
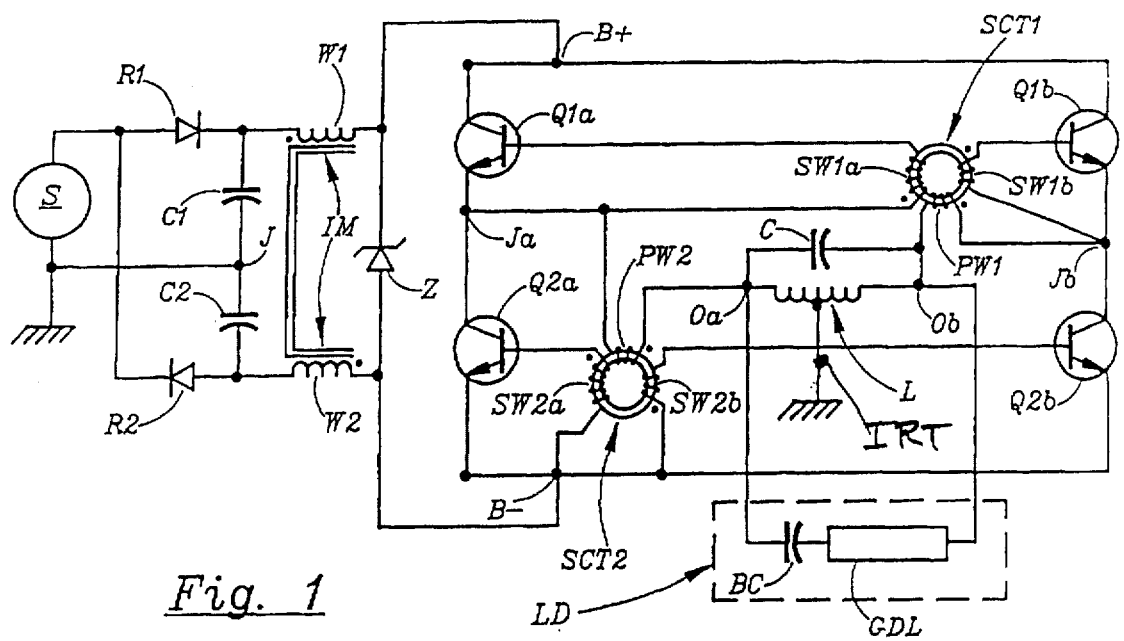
FIG. 1 schematically illustrates the preferred embodiment of the invention.

FIG. 1 shows an AC power supply S, which in reality is an ordinary 120 Volt/60 Hz electric utility power line.

One terminal of power supply S is grounded and also directly connected to a junction J between two energy-storing capacitors C1 and C2. The other terminal of power supply S is connected to the anode of a rectifier R1 and to the cathode of a rectifier R2. Rectifier R1 has its cathode connected to one terminal of C1—the other terminal of C1 being connected to junction J. Rectifier R2 has its anode connected to one terminal of C2—the other terminal of C2 being connected to junction J.

An inductor means IM has two equal but separate windings W1 and W2: W1 is connected between the cathode of rectifier R1 and a junction B+ between the collectors of two transistors Q1a and Q1b; W2 is connected between the anode of R2 and a junction B− between the emitters of two transistors Q2a and Q2b.

A Zener diode Z is connected between junction B+ and junction B−.

Transistor Q1a is connected with its emitter to a junction Ja, as is also the collector of transistor Q2a. Transistor Q1b is connected with its emitter to a junction Jb, as is also the collector of transistor Q2b.

A center-tapped inductor L is connected between inverter output terminals Oa and Ob. Connected in parallel with L is a capacitor C. The center-tap on inductor L, which is referred-to as inverter reference terminal IRT, is grounded.

Primary winding PW1 of saturable current-transformer SCT1 is connected between junction Jb and output terminal Ob. Primary winding PW2 of saturable current-transformer SCT2 is connected between junction Ja and output terminal Oa.

One secondary winding SW1a of transformer SCT1 is connected between the base and the emitter of transistor Q1a; another secondary winding SW1b of transformer SCT1 is connected between the base and the emitter of transistor Q1b.

One secondary winding SW2a of transformer SCT2 is connected between the base and the emitter of transistor Q2a; another secondary winding SW2b of transformer SCT2 is connected between the base and the emitter of transistor Q2b.

A series-combination of a ballasting capacitor CB and a gas discharge lamp GDL constitutes a load LD; which load is connected across output terminals Oa and Ob.

Details of Operation

The operation of the full-bridge inverter circuit of FIG. 1 may be explained as follows.

Source S provides 120 Volt/60 Hz voltage to the voltage-doubling and rectifying/filtering circuit consisting of R1, R2, C1 and C2. A substantially constant DC voltage of about 320 Volt magnitude then results at the output of this circuit, with the positive side of this DC voltage being present at the cathode of R1 and the negative side being present at the anode of R2.

This substantially constant-magnitude DC voltage is applied by way of inductor means IM and its two windings W1 and W2, poled as indicated, to the DC power input terminals B+ and B− of the full-bridge inverter circuit comprising transistors Q1a, Q1b, Q2a and Q2b.

This inverter circuit is made to self-oscillate by way of positive current feedback provided by saturable current-transformers SCT1 and SCT2, poled as indicated. Thus, the magnitude of the current provided to any given transistor's base-emitter junction is proportional to the magnitude of the current flowing between output terminals Oa and Ob.

The frequency of inverter oscillation is determined by a combination of the saturation characteristics of the saturable current-transformers and the natural resonance frequency of the parallel L-C circuit (as combined with any tuning effects caused by the load connected thereacross).

The saturation characteristics of the saturable current-transformers are substantially identical to one another and so chosen that, when there is no load connected across output terminals Oa and Ob, the waveform of the output voltage is as indicated in FIG. 2a; which waveform is made up of sinusoidal half-waves of voltage, indicated by HW1 and HW2, interconnected with periods of zero-magnitude voltage, indicated by ZM1 and ZM2. This waveform is achieved by making the time-length of the saturation-time required for the saturable current-transformers to reach saturation longer than the time-length of one of the sinusoidal half-waves of voltage. The degree to which the time-length of the saturation-time is longer than the time-length of one of the sinusoidal half-waves of voltage corresponds to the time-length of the periods of zero-magnitude voltage.

In FIG. 2a, each of the sinusoidal half-waves of voltage represents the natural interaction between L and C as fed from a substantially constant current source.

In combination, the two separate but equal windings W1 and W2 of inductor means IM provide for a total inductance that is large enough so that the current flowing through the two windings and into the inverter remains substantially constant during a complete time-period of one cycle of the inverter's oscillation.

That is, the DC current flowing into the B+ junction and out of the B− junction is substantially constant during the interval between point X and point Y in FIG. 2a. Thus, whenever the L-C parallel circuit is connected between B+ and B−—which it is during the complete time-length of each of the sinusoidal half-waves of voltage—it is indeed fed from a substantially constant current source.

When a load impedance having a net component of capacitive reactance (such as does LD) is connected across the inverter's output terminals Oa and Ob, capacitive reactance is in effect added to the L-C parallel circuit; which results in the time-lengthening of the sinusoidal half-waves of voltage—as indicated by FIG. 2b. The more capacitance added this way, the more time-lengthening results.

On the other hand, when a load impedance having a net component of inductive reactance is connected between Oa and Ob, the result would be a time-shortening of the sinusoidal half-waves of voltage.

By having two different load impedances connected between Oa and Ob, and by having these two load impedances be of conjugate nature, there will be no net effect on the length of the period of the sinusoidal half-waves. For instance, by having another gas discharge lamp like GDL connected in series with an inductor having a reactance of the same absolute magnitude as that of CB, and by connecting this series-combination in parallel with load LD, the total net load impedance would be resistive and would cause no net shortening or lengthening of the sinusoidal half-waves of voltage.

By making the time-length of the saturation-time of the saturable current-transformers substantially equal to the time-length of one of the sinusoidal half-waves of voltage, the resulting output voltage will be as illustrated in FIG. 2c; which indicates that the net inversion frequency will now be the same as the natural resonance frequency of the L-C parallel circuit (as combined with whatever load impedance might be connected between Oa and Ob).

By making the time-length of the saturation-time of the saturable current-transformers shorter than the time-length of one of the sinusoidal half-waves of voltage, the resulting output voltage will be as illustrated in FIG. 2d; which indicates that the net inversion frequency will now be higher then the natural resonance frequency of the L-C circuit (as combined with whatever load impedance might be connected between Oa and Ob).

Additional Comments (a) As long as the time-length of the saturation-time of the saturable current-transformers remains equal to or longer than the time-length of one of the sinusoidal half-waves of voltage, the net inversion frequency will not be affected by the addition or removal of a load impedance, such as LD of FIG. 1, regardless of the magnitude of the net reactive impedance thereby added to or subtracted from the L-C parallel circuit.

(b) The magnitude of the Zener voltage of Zener diode Z is chosen such as to be somewhat higher than the maximum magnitude of the peak voltage of the sinusoidal half-waves of voltage present across the inverter's output terminals Oa and Ob. That way, the Zener diode will not interfere with normal operation of the inverter; yet, it will prevent the magnitude of the peak voltages of the sinusoidal half-waves from substantially exceeding the normally occurring maximum magnitudes. Without the Zener diode, for various transient reasons (such as due to the sudden removal of a load) the magnitude of the peak voltages of the sinusoidal half-waves would occasionally become substantially larger than the normally occurring maximum magnitudes; and that would either cause transistor destruction, or it would necessitate the use of very special transistors of exceptionally high voltage capabilities.

(c) Inductor L is center-tapped; which, in effect, provides for a center-tap between the inverter's output terminals Oa and Ob. This center-tap is grounded. In many applications, particularly in the case of fluorescent lamp ballasts, it is very valuable to have the output referenced to ground.

(d) Inductor L may be integrally combined with a center-tapped auto-transformer; in which case the output voltage can readily be provided at any desired magnitude, while maintaining a ground-connected center-tap.

(e) Inductor means IM may consist of two entirely independent inductors—with one inductor located in each leg of the power supply. In fact, it is even acceptable under some circumstances to use but a single inductor in just one leg of the power supply; in which case, however, it would not be possible to connect the output's center-tap with the power supply's center-tap.

(f) It is not necessary to power the inverter of FIG. 1 from a voltage doubler. However, doing so provides for the advantage in many situations of being able to reference the center-tap of the inverter's output with one of the legs of the power line.

(g) The inverter of FIG. 1 must be triggered into oscillation. This triggering may be accomplished by way of providing a special trigger winding on each of the feedback current-transformers, and then to discharge a capacitor through these trigger windings. This may be done automatically with an arrangement consisting of a capacitor-resistor combination connected between B+ and B−, and a Diac for discharging the capacitor through the trigger windings.

(h) Finally, it is noted that the average absolute magnitude of the AC voltage appearing between inverter output terminals Oa and Ob must be substantially equal to the magnitude of the DC voltage provided from across the two series-connected energy-storing capacitors C1 and C2.

Or, stated differently, in the circuit of FIG. 1, if the inverter's AC output voltage as provided between terminals Oa and Ob were to be rectified in a full-wave rectifier, the average magnitude of the DC voltage obtained from this full-wave rectifier would have to be substantially equal to the magnitude of the DC voltage supplied from the DC output of the rectifier/filter combination consisting of R1, R2, C1 and C2.

This relationship would have to exist substantially regardless of the nature of the load connected between the inverter's output terminals.

(i) Although the full-bridge inverter circuit of FIG. 1 may be designed to invert at any one of a wide range of frequencies, in the preferred embodiment the inversion frequency is approximately 30 kHz. Thus, the time-length of the interval between point X and point Y of FIG. 2a is about 33 micro-seconds.

Figure 2:
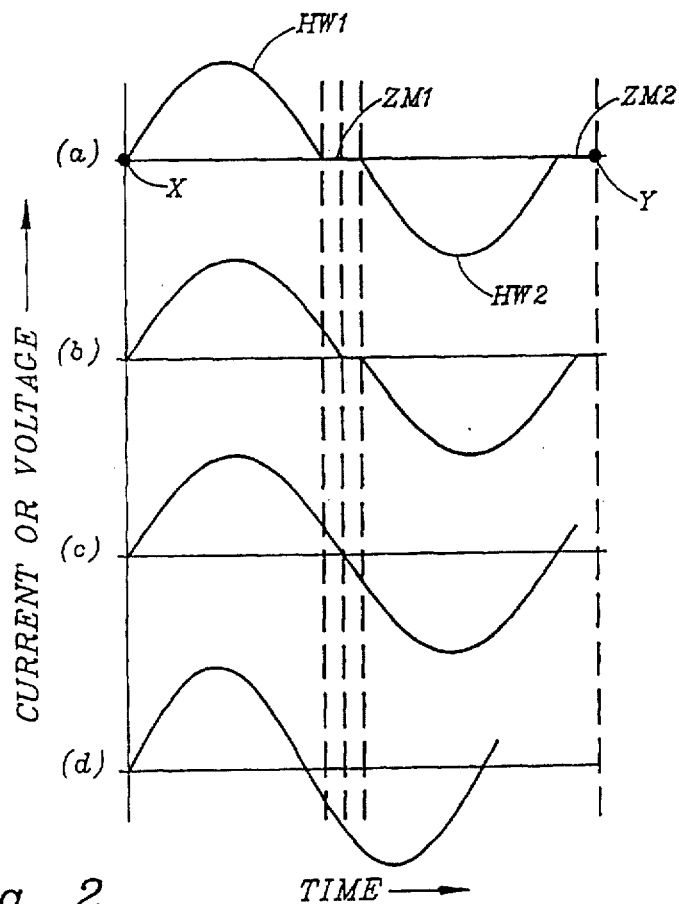
FIG. 2 shows various voltage waveforms associated with the preferred embodiment of the invention.

(j) The waveforms of FIG. 2 depict the voltage present between output terminals Oa and Ob under different operating conditions. Of course, the voltage present between Oa and inverter reference terminal IRT is equal to half the voltage present between terminals Oa and Ob.

(k) Due to the balanced nature of the inverter and its DC power supply, with reference to any one of the terminals of filter capacitors C1 and C2, any high frequency voltage present at inverter reference terminal IRT—even if it were not connected with ground—would have negligible magnitude.

(l) The primary windings of saturable current transformers SCT1 and SCT2 have fewer turns than do the secondary windings. Typically, the transistors operate with a 1:4 primary-to-secondary turns ratio; which corresponds to a forced current gain of four. At that turns ratio, the magnitude of the voltage developing across the primary winding of each of the saturable current transformers is only one fourth of the magnitude of the base-emitter voltage; which, of course, is only about 0.8 Volt.

In other words, the magnitude of the voltage developing across the primary winding of each staturable transformer is only about 0.2 Volt; which, of course, represents a magnitude that is totally negligible in comparisn with the magnitude of the voltage developing between output terminals Oa and Ob.

Thus, the voltage at terminal Ob is substantially equal to the voltage at terminal Jb; and the voltage at terminal Oa is substantially equal to the voltage at terminal Ja.

(m) It is believed that the present invention and its several attendant advantages and features will be understood from the preceeding description. However, without departing from the spirit of the invention, changes may be made in its form and in the construction and interrelationships of its component parts, the form herein presented merely representing the presently preferred embodiment.

I claim:

1. An arrangement comprising:

a DC source functional to provide a DC supply voltage between a first and a second DC supply terminal;

an inverter connected between the first and second DC supply terminals; the inverter being functional to cause a high-frequency AC inverter voltage to exist between a first and a second AC terminal; the high-frequency AC inverter voltage being of frequency several times higher than 60 Hz; any high-frequency AC voltage that might exist between the second AC terminal and one of the DC supply terminals being of very small magnitude compared with the magnitude of the high-frequency AC inverter voltage; the inverter being further characterized by including: (i) a first transistor having a first control input terminal, a first output terminal, and a first common terminal; and (ii) a second transistor having a second control input terminal, a second output terminal, and a second common terminal; the second output terminal being connected with the first common terminal, thereby to form a junction terminal; the junction terminal being connected with the first AC terminal in such manner that: (i) substantially no uni-directional voltage drop can exist between the junction terminal and the first AC terminal, and (ii) any alternating voltage existing between the junction terminal and the first AC terminal is of very small magnitude compared with the magnitude of the high-frequency AC inverter voltage; a unidirectional voltage existing between the second common terminal and the first output terminal; the average magnitude of the unidirectional voltage being substantially equal to that of the DC supply voltage; the inverter being additionally characterized by including a control circuit functional to cause the AC inverter voltage to consist of a continuous sequence of sinusoidally-shaped voltage pulses of alternating polarity; each such voltage pulse being separated from the next-following voltage pulse by a brief period during which the intantaneous magnitude of the AC inverter voltage undergoes a discontinuous change; and a gas discharge lamp connected in circuit with the AC output terminals.

2. The arrangement of claim 1 wherein, during most of the brief period, the instantaneous magnitude of the AC inverter voltage remains at a substantially constant level.

3. The arrangement of claim 2 wherein the substantially constant level is of near zero magnitude.

4. The arrangement of claim 1 wherein, during the brief period, the absolute value of the rate-of-change of the instantanous magnitude of the AC inverter voltage decreases temporarily from a first level to a second level; the first level being distinctly higher than the second level.

5. The arrangement of claim 4 wherein the second level is equal to zero.

6. The arrangement of claim 1 wherein the absolute value of the rate-of-change of the instantaneous magnitude of the AC inverter voltage is substantially lower during most of the brief period as compared with just before and just after the brief period.

7. An arrangement comprising:

an AC source functional to supply an AC power line voltage at a pair of AC power line terminals;

rectifying and filtering circuit connected with the AC power line terminals and functional to provide a DC supply voltage at a pair of DC supply terminals;

a gas discharge lamp having lamp terminals; and a ballasting circuit having DC input terminals connected with the DC supply terminals and AC output terminals connected with the lamp terminals; the ballasting circuit being functional to power the gas discharge lamp and being otherwise characterized by having: (i) a first transistor with a first transistor terminal connected with a second transistor terminal of a second transistor; the two transistors being series-connected between a pair of terminals across which is provided a unidirectional voltage; and (ii) a sub-circuit functional, by way of positive feedback, to cause an AC inverter voltage to exist between the first transistor terminal and one of the DC input terminals; the frequency of the AC inverter voltage being several times higher than that of the AC power line voltage; the waveform of the AC inverter voltage being substantially sinusoidal.

8. An arrangement comprising:

an AC source functional to supply an AC power line voltage at a pair of AC power line terminals;

rectifying and filtering circuit connected with the AC power line terminals and functional to provide a substantially constant-magnitude DC supply voltage between a first and a second DC supply terminal;

an inductor having a first winding and a second winding;

a lamp load having a pair of lamp load terminals and including a series-combination of a gas discharge lamp and a current-limiting reactance means; and an inverter circuit including: (i) at least two transistors, each having transistor control terminals; (ii) a pair of AC output terminals connected with the load terminals; (iii) circuitry connected with the AC output terminals as well as with the transistor control terminals, the circuitry being functional via positive feedback to cause an AC output voltage to exist across the AC output terminals; (iv) a first DC input terminal connected with the first DC supply terminal by way of the first winding; the first DC input terminal being connected with a terminal of a first one of said at least two transistors; and (v) a second DC input terminal connected with the second DC supply terminal by way of the second winding; the second DC input terminal being connected with a terminal of a second one of said at least two transistors.

9. The arrangement of claim 8 wherein the AC output voltage consists of a continuous sequence of sinusoidally-shaped voltage pulses of alternating polarity.

10. An arrangement comprising:

an AC source functional to supply an AC power line voltage at a pair of AC power line terminals;

rectifying and filtering circuit connected with the AC power line terminals and functional to provide a filtered DC supply voltage between a first and a second DC supply terminal; the magnitude of the DC supply voltage being substantially constant;

an inductor having a first winding and a second winding;

a lamp load having a pair of load terminals; and an inverter circuit characterized by including: (i) at least two transistors, each having control terminals; (ii) AC output terminals operable to connect with the load terminals; (iii) control circuitry connected with AC output terminals as well as with the control terminals, thereby via positive feedback to cause an AC output voltage to exists at the AC output terminals; and (iv) having a first DC input terminal connected with the first DC supply terminal by way of the first winding; and (v) having a second DC input terminal connected with the second DC supply terminal by way of the second winding; the inverter circuit being further characterized in that said at least two transistors are series-connected across the DC input terminals.

11. An arrangement comprising:

an AC source functional to supply an AC power line voltage at a pair of AC power line terminals;

rectifying and filtering circuit connected with the AC power line terminals and functional to provide a filtered DC supply voltage between a first and a second DC supply terminal;

an inductor having a first winding and a second winding;

a lamp load having a pair of load terminals; the lamp load being additionally characterized by including an impedance device series-connected with a fluorescent lamp; and an inverter characterized by including: (i) transistors, each having control terminals; (ii) output terminals connected with the load terminals, an inverter voltage being provided across the output terminals; (iii) control circuitry connected within the inverter and functional to cause the inverter voltage to consist of a continuous sequence of sinusoidally-shaped voltage pulses of alternating polarity; the inverter voltage being additionally characterized in that: (a) adjacent voltage pulses are separated by a brief cross-over period during which polarity of the inverter voltage reverses; and (b) the rate-of-change of the inverter voltage is substantially different during most of the cross-over period as compared with just before or just after the cross-over period; (iv) having a first DC input terminal connected with the first DC supply terminal by way of the first winding; and (v) having a second DC input terminal connected with the second DC supply terminal by way of the second winding.

12. An arrangement comprising:

an AC source functional to supply an AC power line voltage at a pair of AC power line terminals;

rectifying and filtering circuit connected with the AC power line terminals and functional to provide a DC supply voltage at a pair of DC supply terminals;

a lamp load having a pair of lamp terminals; the lamp load being additionally characterized by including a reactance device series-connected with a gas discharge lamp; and a ballasting circuit having DC input terminals connected with the DC supply terminals and AC output terminals connected with the lamp terminals; the ballasting circuit being functional to power the gas discharge lamp and being otherwise characterized by having: (i) a first transistor with a first transistor terminal connected with a second transistor terminal of a second transistor; and (ii) a sub-circuit functional to cause an AC inverter voltage to exist between the first transistor terminal and one of the DC input terminals; the AC inverter voltage consisting of sinusoidally-shaped voltage pulses of alternating polarity; adjacent voltage pulses being separated by a brief period of discontinuity in the rate-of-change of voltage.

13. An arrangement comprising:

an AC source functional to supply an AC power line voltage at a pair of AC power line terminals;

rectifying and filtering circuit connected with the AC power line terminals and functional to provide a DC power supply voltage at a pair of DC supply terminals;

a gas discharge lamp having lamp terminals; and a ballasting circuit having DC input terminals connected with the DC supply terminals and AC output terminals connected with the lamp terminals; the ballasting circuit being functional to power the gas discharge lamp and being otherwise characterized by having: (i) a first transistor with a first transistor terminal connected with a second transistor terminal of a second transistor; and (ii) a sub-circuit functional (a) to cause a substantially sinusoidal AC inverter voltage to exist between the first transistor terminal and one of the DC input terminals; and (b) to cause the transistors to conduct current alternatingly, except for a brief period once each complete cycle of the AC inverter voltage, during which brief period both transistors conduct current simultaneously.

14. An arrangement comprising:

a first electronic assembly having AC power input terminals connected an AC power line voltage and DC output terminals at which is provided a DC supply voltage of substantially constant magnitude;

a gas discharge lamp having lamp terminals; and a second electronic assembly characterized by including: (i) DC input terminals connected with the DC supply terminals; (ii) a pair of transistors connected together at a junction terminal; (iii) a pair of output terminals; (iv) a sub-assembly operative via positive feedback (a) to cause the transistors to conduct alternatingly, (b) to cause a first inverter voltage to exist between the junction terminal and one of the DC supply terminals, which first inverter voltage consists of a sequence of sinusoidally-shaped voltage pulses of alternating polarity, and (c) to cause a second inverter voltage to exist between the output terminals; and (v) a sub-circuit connected with the output terminals as well as with the lamp terminals, thereby to provide power to the gas discharge lamp.

15. The arrangement of claim 14 wherein adjacent ones of the sinusoidally-shaped voltage pulses are separated by a brief period during which the rate-of-change of the inverter voltage exhibits a distinct discontinuity.

16. An arrangement comprising:

a first electronic assembly having AC power input terminals connected with an AC power line voltage and being functional to provide a DC supply voltage between a negative DC supply terminal and a positive DC supply terminal;

a gas discharge lamp having lamp terminals; and a second electronic assembly having:

(i) DC input terminals connected with the DC supply terminals;

(ii) a pair of transistors connected together at a junction terminal; each transistor having transistor control terminals;

(iii) a pair of output terminals;

(iv) circuitry operative to connect the transistors in circuit with the DC input terminals as well as to provide feedback between the output terminals and the transistor control terminals, thereby to cause the transistors to conduct alternatingly and in such manner as to cause an alternating inverter voltage to exist between the junction terminal and one of the DC supply terminals as well as to cause an alternating output voltage to exist between the output terminals; the alternating inverter voltage consisting of a train of sinusoidally-shaped voltage pulses of alternating polarity; and (v) a sub-structure connected between the output terminals and the lamp terminals, thereby to provide power to the gas discharge lamp.

17. An arrangement comprising:

a source operative to provide, between a first and a second DC terminal, a DC voltage of substantially constant magnitude;

an inverter circuit connected with the DC terminals and functional to provide an alternating inverter voltage between a reference terminal and an inverter output terminal; the alternating inverter voltage consisting of a train of sinusoidally-shaped voltage pulses of alternating polarity, with adjacent voltage pulses being separated by a brief period during which the rate-of-change of the instantaneous magnitude of the alternating inverter voltage exhibits a distinct discontinuity; the inverter circuit including a tuned L-C circuit connected in circuit with the inverter output terminal and the reference terminal; the L-C circuit having a tank inductor parallel-connected with a tank capacitor means and being resonant at or near the frequency of the alternating inverter voltage; the inverter circuit being further characterized in that: (i) it includes a first intermittently conducting transistor having a first transistor terminal connected with the inverter output terminal in such manner that no voltage of substantial magnitude can exist between the transistor terminal and the inverter output terminal, the term substantial magnitude being defined as a magnitude larger than one tenth the magnitude of the alternating inverter voltage; (ii) any AC voltage, of frequency equal to that of the inverter AC voltage, existing between the reference terminal and the first DC terminal is of negligible magnitude compared with the magnitude of the alternating inverter voltage; and (iii) any AC voltage, of frequency equal to that of the inverter AC voltage, existing between the first and second DC terminals is of negligible magnitude compared with the magnitude of the alternating inverter voltage; and gas discharge lamp means connected in circuit with the L-C circuit.

18. An arrangement comprising:

a source operative to provide, between a first and a second DC terminal, a DC voltage of substantially constant magnitude;

an inverter circuit connected with the DC terminals and functional to provide an inverter voltage between a reference terminal and an inverter output terminal; the inverter voltage being an alternating voltage of frequency several times higher than 60 Hz and otherwise characterized by consisting of a train of sinusoidally-shaped voltage pulses of alternating polarity, with adjacent voltage pulses being separated by a brief period during which the rate-of-change of the inverter voltage exhibits a distinct discontinuity; the inverter circuit including a tuned L-C circuit connected in circuit with the inverter output terminal and the reference terminal; the L-C circuit having a tank inductor parallel-connected with a tank capacitor means and being resonant at or near the frequency of the inverter voltage; the inverter circuit being further characterized in that it includes two alternatingly conducting transistors series-connected between two auxiliary terminals between which exists a unidirectional voltage consisting of sinusoidally-shaped unidirectional voltage pulses, and having an average magnitude substantially equal to that of the DC voltage.

19. An arrangement comprising:

a source providing, between a first and a second DC supply terminal, a constant-magnitude DC supply voltage;

an electronic circuit having a first and a second input terminal as well as a pair of output terminals; the electronic circuit including a sub-assembly functional to cause an output voltage to exist across the output terminals, but only as long as unidirectional current is supplied to the input terminals; the output voltage consisting of a train of sinusoidally-shaped voltage pulses of alternating polarity, with adjacent voltage pulses being separated by a brief period during which the rate-of-change of the output voltage exhibits a distinct discontinuity;

inductor having a first winding and a second winding; the first winding being connected between the first DC supply terminal and the first input terminal; the second winding being connected between the second DC supply terminal and the second input terminal; thereby to supply unidirectional current to the input terminals; and output means connected with the output terminals; the output means having lamp output terminals adapted to connect with a gas discharge lamp.

20. The arrangement of claim 19 wherein the electronic circuit is additionally characterized in that, as long as unidirectional current is indeed supplied to the input terminals, a pulsating unirectional voltage exists across these input terminals; the pulsating unidirectional voltage consisting of a train of unidirectional sinusoidally-shaped voltage pulses, with adjacent voltage pulses being separated by a brief period during which the rate-of-change of the absolute instantaneous magnitude of the pulsating unidirectional voltage exhibits a distinct discontinuity.

* * * * *